US008458545B2

(12) United States Patent
Roy et al.

(10) Patent No.: US 8,458,545 B2
(45) Date of Patent: Jun. 4, 2013

(54) METHOD AND APPARATUS FOR TESTING OF A MEMORY WITH REDUNDANCY ELEMENTS

(75) Inventors: Tanmoy Roy, Noida (IN); Harsh Rawat, Haryana (IN); Swapnil Bahl, New Delhi (IN); Amit Chhabra, Delhi (IN); Nitin Jain, Ghaziabad (IN); Jatin Fultaria, Rajkot (IN)

(73) Assignee: STMicroelectronics International N.V., Amsterdam (NL)

( * ) Notice: Subject to any disclaimer, the term of this patent is extended or adjusted under 35 U.S.C. 154(b) by 239 days.

(21) Appl. No.: 12/955,354

(22) Filed: Nov. 29, 2010

(65) Prior Publication Data

US 2012/0137188 A1    May 31, 2012

(51) Int. Cl.
*G01R 31/28* (2006.01)

(52) U.S. Cl.
USPC .......................................... 714/733; 714/724

(58) Field of Classification Search
USPC .................................. 714/733, 724, E11.001
See application file for complete search history.

(56) References Cited

U.S. PATENT DOCUMENTS

| | | | | |
|---|---|---|---|---|
| 5,920,515 | A * | 7/1999 | Shaik et al. | 365/200 |
| 6,208,570 | B1 * | 3/2001 | Brown et al. | 365/201 |
| 2003/0237033 | A1 * | 12/2003 | Borri et al. | 714/718 |
| 2004/0001377 | A1 * | 1/2004 | Kobayashi | 365/201 |
| 2005/0007841 | A1 * | 1/2005 | Nagata et al. | 365/200 |
| 2006/0031726 | A1 * | 2/2006 | Zappa et al. | 714/718 |
| 2006/0294443 | A1 * | 12/2006 | Fekih-Romdhane | 714/738 |
| 2009/0097343 | A1 * | 4/2009 | Katrak et al. | 365/201 |
| 2009/0154270 | A1 * | 6/2009 | Barth Jr. et al. | 365/201 |
| 2009/0158224 | A1 * | 6/2009 | Barth, Jr. et al. | 716/4 |
| 2009/0290436 | A1 * | 11/2009 | Hur et al. | 365/189.05 |
| 2011/0231717 | A1 * | 9/2011 | Hur et al. | 714/718 |

OTHER PUBLICATIONS

P.Ravinder, N.Uma Rani / International Journal of Engineering Research and Applications (IJERA)/ vol. 1, Issue 3, pp. 778-785 / Design and Implementation of Built-in-Self Test and Repair / Posted Sep. 15, 2011.*

* cited by examiner

*Primary Examiner* — Ajay Bhatia
*Assistant Examiner* — Thien D Nguyen
(74) *Attorney, Agent, or Firm* — Gardere Wynne Sewell LLP

(57) ABSTRACT

A circuit includes an input node configured to receive a test address input signal and circuitry configured to generate, from a first part of the test address input signal, a first address signal that selects a first address of a first part of a circuit to be tested and further generate, from a second part of the test address input signal, a second signal configured to select a second part of the circuit to be tested. Test circuitry is then configured to use the first address and the second part in a test mode.

31 Claims, 2 Drawing Sheets

METHOD AND APPARATUS FOR TESTING OF A MEMORY WITH REDUNDANCY ELEMENTS

TECHNICAL FIELD

The present invention relates to testing, for example, but not exclusively, an integrated circuit and more specifically to integrated circuit memory testing wherein the memory includes redundant circuit elements.

BACKGROUND

Despite advances in semiconductor process technology, it is well known that integrated circuit memories can be manufactured with errors. Just a single bit error can render a memory unusable, and because of this manufacturers have implemented various techniques to repair memories in which memory cells can be identified as being faulty. For example, memories can include redundant rows or columns of memory cells. These redundant circuits are not used when the memory's non-redundant memory cells contain no manufacturing errors. However, should a memory cell be determined to be faulty, a redundant memory component can be substituted for one of the non-redundant memory components such that the overall memory component (although including the faulty memory cell) can still be used. For example, a redundant row of memory cells can instead be addressed in a row redundancy scheme where a non-redundant row is determined to include a faulty memory cell.

In order to speed up the diagnosis of errors in memory cells, integrated circuits are often provided with built-in self-testing (BIST) circuitry. The BIST circuitry can be used to test parts of the circuit. For example, an integrated circuit which has BIST circuitry can be tested by automated test equipment (ATE). As the overall yield of a system-on-chip, for example, is dominated by the yield of the included memory cores, the use of some type of redundancy scheme for the memory cores can assist in improving device yield to almost 99%.

Typically, during testing at production level, the memory is also tested. If one or more locations of the memory are not functional, the redundant circuits can be invoked inside the memory. After repair, the memory is tested again for complete functionality. Where all of the memory locations are properly functioning, the redundancy elements are not typically tested at all.

However, even where the memory is initially determined to be fully functional in the first run, it may be of some use to also test the redundancy elements. For example, it can be useful in providing in-field repair capability to the memory should the memory subsequently develop a failure. In such a case wherein the fault arises during the working life of the memory, the memory is capable of being repaired by invoking the redundancy (provided there is no fault in the redundant circuitry).

Several processes have been proposed in order to support an "in field" testing of the memory. All of the approaches mentioned are used for testing the memory at the time of production. If the memory has a failing location, it is discarded. If all the address space of the memory is functional, then the memory is tested again for the repair elements.

In a first approach the entire memory is first checked (this is referred to as a CEM or check entire memory operation) with the redundancy elements disabled, followed by a further test where for each redundancy address on the redundancy pin of the memory, the entire memory is checked with the redundancy enabled.

In such an approach, while the comparator logic has been tested sufficiently, testing the regular array faults have not created proper stress patterns including a row fast pattern, that is a part of standard built-in self-test (BIST) algorithm. Hence, the failing row and the row adjacent to it are not stressed to the maximum. Although this is a fairly simple built-in self-test algorithm, it requires a prohibitive amount of time in order to carry it out.

To attempt to overcome the speed penalty of the above, such systems alter the second testing step, the step prior to repair, by setting the redundancy address pin at 0. In other words the redundancy row is set adjacent to actual row 0 and testing the entire memory with the redundancy is enabled. However, this approach not only fails to create proper stress patterns but also fails to check for decoder faults.

Furthermore, to further speed up the testing process the redundancy address pin can be set to 0 and only the locations 0 and 1 are checked. Although this is the fastest of the three test processes described, this has the additional problem of a higher probability of missing decoder faults.

A need exists in the art to address the foregoing testing problems.

SUMMARY

Embodiments disclosed herein overcome the foregoing problems by providing a single step testing approach prior to repair by providing increased address space to the built-in self-test. By using increased address space testing, the single step testing process can have the advantage of thoroughly checking for array faults, address decoder faults and also enabling a run fast algorithm to be operated on the built-in self-testing circuitry.

According to a first aspect, there is provided a circuit comprising: an input node configured to receive a test address input signal; circuitry configured to generate from a first part of the test address input signal a first address signal configured to select a first address of a first part of the circuit and circuitry configured to generate from a second part of the test address input signal a second signal configured to select a second part of the circuit; and test circuitry configured to use the first address and the second part in a test mode.

The test circuitry may be configured to test the first part of the circuit using the first part of the test address input signal and a first value of the second signal to produce a first test result.

The test circuitry may be further configured to test the second part of the circuit using the first part of the test address input signal and a second value of the second signal to produce at least a second test result.

The second part of the circuit may comprise at least one comparator, each comparator configured to compare the first part of the test address input signal and a determined value associated with each comparator to generate a check result, wherein the check result is at least one of the first and second test result.

The circuit may further comprise a determined value generator configured to be coupled to the at least one comparator, wherein in a test mode the determined value generator is configured to generate a value associated with each comparator.

The determined value generator in a functional mode may be configured to output a value associated with a faulty memory address.

The circuit may further comprise a selector further configured to selectively output the check result dependent on the second signal.

The selector may comprise: an AND logic gate comprising a first input configured to receive the check result and a second input configured to selectively receive the second signal.

The circuit may further comprise a second signal selector coupled to the selector and configured to selectively output the second signal when the circuit is in the test mode.

The second signal selector may comprise a multiplexer configured to output as the second signal the second part of the test address input signal when the circuit is in the test mode.

The circuit may be further configured to be an integrated circuit.

A test arrangement may comprise: the circuit as described herein; and a test controller configured to be coupled to the circuit and generate the test address input signal.

The test controller may be further configured to receive the circuit test result.

The circuit may comprise at least one memory circuit and the test controller may comprise at least one memory built-in self-test circuit.

The test arrangement may be a component of a system on chip.

According to a second aspect, there is provided a method comprising: receiving a test address input signal; generating from a first part of the test address input signal a first address signal configured to select a first address of a first part of a circuit; generating from a second part of the test address input signal a second signal configured to select a second part of the circuit; and operating test circuitry using the first address and the second part in a test mode.

The step of operating test circuitry may comprise testing the first part of the circuit using the first part of the test address input signal and the first value of the second signal to produce a first test result.

The step of operating test circuitry may further comprise testing the second part of the circuit using the first part of the test address input signal and a second value of the second signal to produce at least a second test result.

The step of selecting the second part of the circuit may comprise selecting at least one comparator, and the step of operating test circuitry may further comprise comparing the first part of the test address input signal and a determined value associated with each comparator to generate a check result, wherein the check result is at least one of the first and second test result.

The method may further comprise generating a determined value to be associated with each of the at least one comparator, wherein generating a determined value in a functional mode may comprise generating a value associated with a faulty memory address.

The method may further comprise selectively outputting the check result dependent on the second signal, wherein selectively outputting the check result may comprise ANDing the check result and the second signal.

The method may further comprise selectively outputting the second signal when the circuit is in the test mode, wherein selectively outputting the second signal when the circuit is in the test mode may comprise outputting as the second signal the second part of the test address input signal when the circuit is in the test mode.

The method may further comprise generating the test address input signal.

According to a third aspect there is provided a circuit, comprising: a first input adapted to receive a functional memory address for a memory to be tested and a second input adapted to receive a memory test address for the memory to be tested. Aa first multiplexer has inputs coupled to the first and second inputs and further has a selection input adapted to receive a built-in self test control signal. The first multiplexer is adapted to select for output between the functional memory address and the memory test address in response to the built-in self test control signal. A third input is adapted to receive a memory redundancy address. A first logic circuit has inputs coupled to the third input and to the built-in self test control signal, the first logic circuit adapted to output a logical combination of the memory redundancy address and the built-in self test control signal. A comparison circuit is adapted to receive and compare the output of the first multiplexer and the output of the first logic circuit to generate a first output signal.

The circuit further comprises a fourth input adapted to receive a redundant row address enable signal and a fifth input adapted to receive a test redundant row address enable signal. A second multiplexer has inputs coupled to the fourth and fifth inputs and further has a selection input adapted to receive the built-in self test control signal. The second multiplexer is adapted to select for output between the redundant row address enable signal and the test redundant row address enable signal in response to the built-in self test control signal.

The circuit still further includes a second logic circuit adapted to receive and logically combine the first output signal and the output of the second multiplexer so as to output a second output signal.

BRIEF DESCRIPTION OF THE DRAWINGS

Reference will be made by way of example only to the accompanying drawings in which.

DETAILED DESCRIPTION OF THE DRAWINGS

Figure 1:
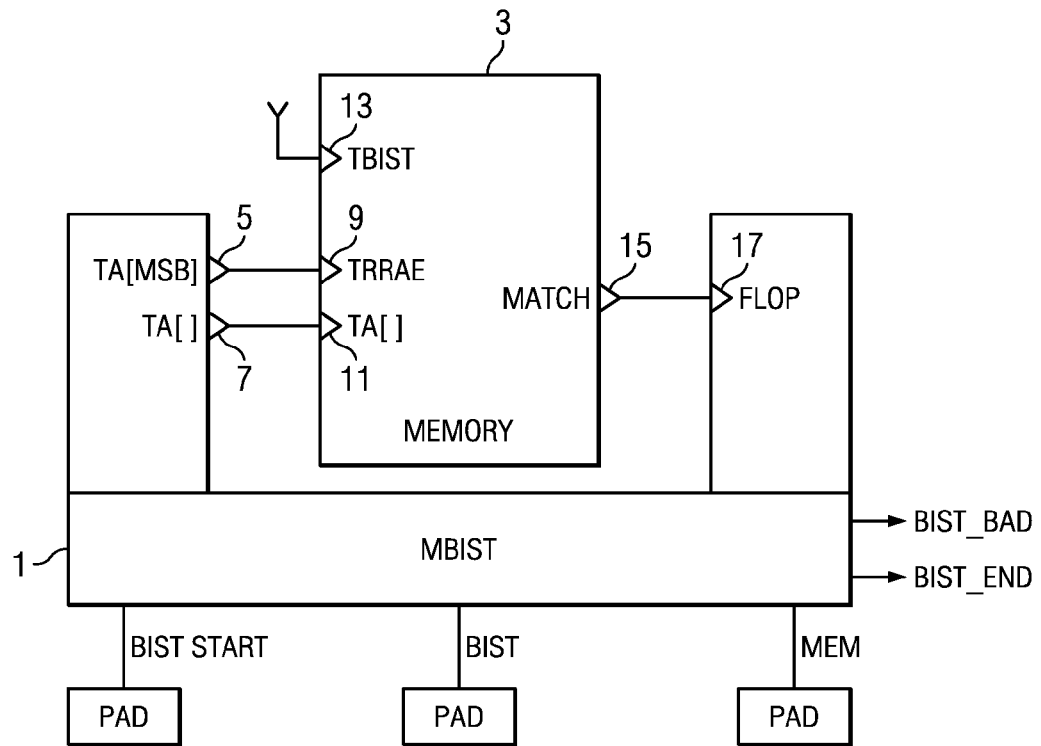
FIG. 1 shows schematically a typical memory built-in self-test arrangement according to an embodiment of the application.

Reference is first made to FIG. 1 which shows a schematic view of a typical memory BIST (mBIST) connection. In the arrangement shown in FIG. 1, a memory 3 is shown. In other embodiments there can be more than one memory 3. Coupled to the memory 3 is a respective or associated memory built-in self-test (mBIST) circuit 1. In such embodiments where there are multiple memories there can be multiple memory BIST circuits each associated with a respective memory.

The BIST circuitry 1 can be arranged to receive a BIST START signal which is input via an input pad. Additionally the BIST circuitry 1 is arranged to receive the same BIST and MEM (memory) clock signal again via one or more input pads.

Each BIST circuit 1 can furthermore be arranged to provide an output of a BIST_BAD signal and a BIST_END signal. These two signals may be regarded as status flags. The BIST_END has a status which when asserted indicates that the BIST run has been completed. When the BIST_END signal goes high indicating that the BIST run has finished, the state of the BIST_BAD signal indicates whether the memory, on which the BIST is run, is for example free or not of physical defects.

One or both of the BIST_BAD and BIST END signals are asserted when the signal goes high. However, one or both of the BIST_BAD and BIST END signals may be asserted when the signal goes low in other embodiments. In the example described now, both of the BIST_BAD and BIST END signals are asserted when the signal goes high.

The memory 3 and the memory built-in self-test (mBIST) circuitry 1 can be coupled via a series of buses or connections configured to pass digital signals between the memory 3 and memory built-in self-test circuitry 1. For example, the memory 3 can be configured to receive a signal by an input memory pin TBIST (transparent built-in self-test) 13. The memory 3 input pin TBIST 13 is configured to switch the memory from being in a test mode to a functional mode. In other words, to switch between operation in a functional pin layout and a test pin layout. Thus, in some embodiments the TBIST pin input can be configured to enable the built-in self-test procedures to avoid the functional pathways of the memory. In other words a functional path can be defined from functional pins, for example A (address), D (data), etc., to the memory array. The same memory array can in such embodiments be made accessible by TA (Test Address), TD (Test Data) pins when the memory is operated in a BIST mode. So in such embodiments, when TBIST=1, the control of the memory array shifts from functional logic to BIST logic enabling the BIST to test the memory. In some embodiments this can be implemented by a multiplexer that enables a switching between A pins and TA pins controlled by the TBIST input.

Furthermore, the memory 3 can be coupled to the built-in self-test circuitry 1 using a test coupling configured to pass a test address value output on the test address pins TA[ ] from the built-in self-test circuitry 1 to the memory 3. In the example shown in FIG. 1, the coupling shows the test address TA[ ] pin layout being configured in two parts.

The first part of the test address TA signal comprises the most significant bit(s) TA[MSB] test address pins 5 from the built-in self-test circuitry 1. This TA[MSB] signal is passed to a memory input pin TRRAE (Test redundant row address enable) 9. The input pin TRRAE 9 is configured therefore to enable the input of data to the redundant row addresses, in other words the TRRAE input is an input determining or designating whether or not the redundant row addresses are being tested.

The second part of the test address signal comprises the remainder of the bits TA[ ] 7 test address pins from the built-in self-test circuitry 1. These signals are passed to the associated memory test address input pin configuration TA[ ] 11. For example, in some embodiments in a 128 row memory, the functional address range can be indicated by a 7 bit number A[0:6], and similarly requires a test address 7 bit number TA[0:6]. In such embodiments, the TA[MSB] value is an additional bit supplied to provide the TRRAE input. In other words memory TA[0:6]=BIST TA[0:6] and memory TRRAE=BIST TA[7]. In some embodiments this is valid for non-binary bits as well, thus for example—100 words, A[0:6], memory TA[0:6], BIST TA[0:7]. Therefore, independent of the cut size, in such embodiments there is always a TRRAE pin in the memory and an additional TA in the BIST coupled together.

Furthermore, the match output pin signals can be passed from the MATCH output pin 15 of the memory 3 and be coupled to the flop input pin FLOP 17 of the built-in self-test circuitry 1.

Figure 2:
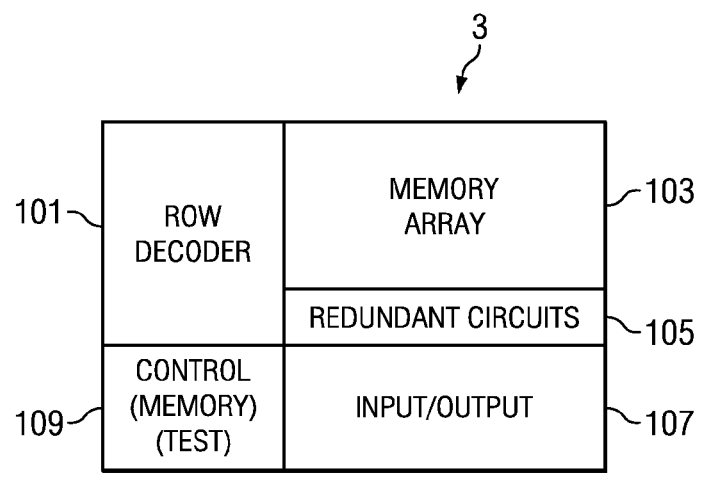
FIG. 2 shows schematically a memory suitable for implementation within the built-in self-test arrangement.

Reference is further made to FIG. 2 which shows a schematic overview of a typical memory 3 with respect to an embodiment of the application. The memory 3 employed in the embodiment of the application comprises an address decoder which in some embodiments comprises at least an X-decoder or row decoder 101 configured to receive inputs to activate a desired row from the address input pins such as the TA[ ] input.

The memory 3 further can comprise a control section 109, which in turn may comprise a memory controller section for controlling the operation of the memory and a test controller section for controlling the memory during testing operations such as performing the built-in self-test.

The memory 3 further comprises a memory core which in some embodiments comprises the memory array 103 which can be any suitable memory array configuration or technology. Furthermore, the memory core can further comprise in some embodiments a single or multiple redundant rows of memory cells. In the example shown in FIG. 2 there is one row of redundant memory cells shown 105. However, it would be understood that there may be more than one redundant row 105 of memory cells. Although redundant row(s) are discussed it will be appreciated that in some embodiments there can be redundant columns of memory cells which can be implemented in similar ways to that described herein with regards to the redundant row configuration.

Furthermore the memory 3 can comprise in some embodiments an input/output subsystem 107 configured to receive and output data via various couplings, for example the input/output subsystem 107 can be configured to receive signals from the input and output pins described herein.

Although the memory 3 has been described comprising the features described herein, it would be understood that any suitable architecture of memory can be used. For example, a banked memory architecture could implement embodiments of the application as herein described.

Figure 3:
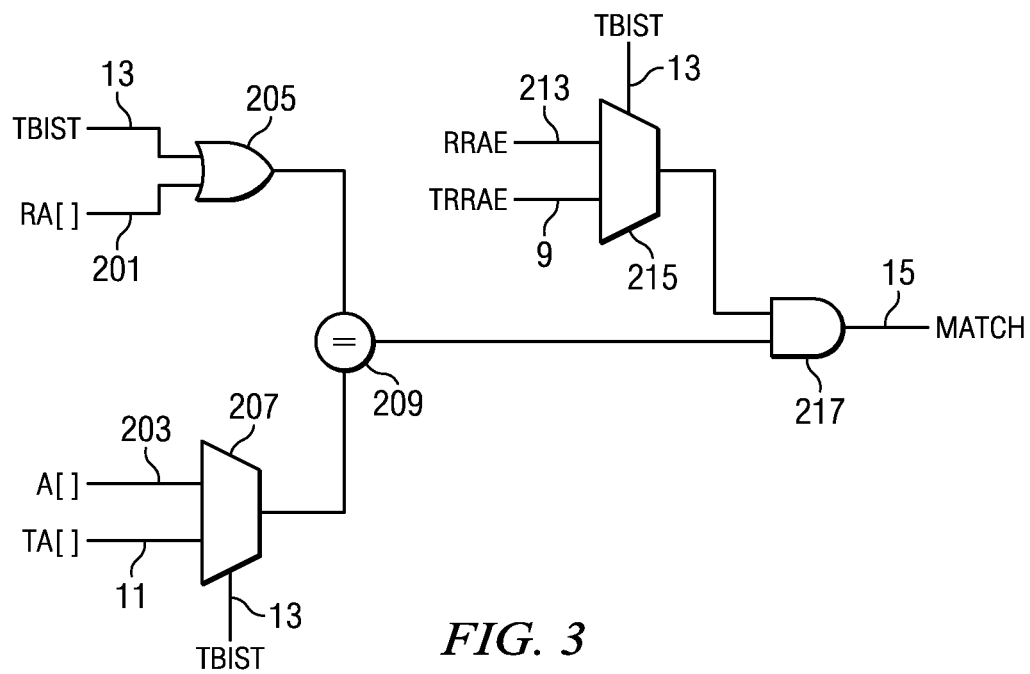
FIG. 3 shows circuitry implemented within the memory in further detail according to an embodiment of the application.

With respect to FIG. 3, an implementation of the memory and built-in self-test control architecture are described using an extended address embodiment. The test apparatus shown in FIG. 3 comprises an input selection multiplexer 207. The input selection multiplexer 207 can be configured to receive the TBIST input signal 13 as a selection input. Furthermore the input selection multiplexer 207 is configured to receive the functional memory address input A[ ] 203 from the input pins as a first input and the memory test address input (memory TA[ ]) 11 as a second input. The input selection multiplexer 207 is configured to select the memory test address input TA[ ] when the TBIST input is active, and alternatively select the address input A[ ] when the TBIST 13 input is inactive. The input selection multiplexer 207 is further coupled to pass the output from the multiplexer (the selected one of the functional memory address input A[ ] or memory test address input TA[ ]), to the input of a comparator logic part 209.

The test circuitry 200 further comprises a redundant row selector circuit which in some embodiments can be an OR gate or OR logic circuit 205. The redundant row selector 205 receives the redundancy address RA[ ] signal 201 which indicates which row within the memory has failed. In other words, this is the address of the row not being or to be tested. Furthermore, the redundant row selector 205 receives the TBIST input 13. The output of the row selector 205 is passed to the comparator logic part 209.

The first comparator logic part 209 is configured to receive the signals from the outputs of the input selection multiplexer 207 and the redundant row selector 205. In some embodiments the comparator logic part 209 can be implemented by an Exclusive OR (XOR), Not AND (NAND) and Not OR (NOR) logic combination that receives the outputs of redundant row selector 205 and input selection multiplexer 207 as inputs. These inputs in such embodiments are bus signals, where the width of the bus is equal to the number of address pins (in other words the number of address pins=log 2(memory words)).

The comparator logic part 209 therefore operates in the functional mode to compare the redundant address and actual address. In the functional mode the input selection multiplexer 207 is configured to output the A[ ] value and the redundant row selector 205 the RA[ ] value. If the A[ ] and RA[ ] values are equal (in other words the comparator is configured to return a value 1), then the redundancy row is accessed. If not, the address row is accessed.

The comparator logic part 209 in the BIST mode (in other words when TBIST=1), is configured to receive from the input selection multiplexer 207 the TA [ ] value or address from the BIST and from the redundant row selector 205 the TBIST=1 value. In other words the redundancy address information is ignored. The comparator compares the TA [ ] with a constant value of all 1's.

In some embodiments the comparator logic part 209 can be configured to comprise multiple comparators each associated with a redundancy row address and further configured to receive a modified output from the redundant row selector 205 or comprise circuitry to modify the redundant row selector 205 output signals. For example in some embodiments where there are 'n' rows of memory cells provided for redundancy, then there can be 'n' comparators. In such embodiments one of the inputs to each of the 'n' comparators can be the output of the input selection multiplexer 207 and the other input to each comparator can be an output of a further multiplexer controlled by the TBIST signal input and configured to output one of a determined redundancy address value associated with the redundancy row RA_n[ ] (where n is the associated redundancy row) and a determined value.

The multiplexer is the OR logic implementation of the redundant row selector 205 which multiplexes between the input value RA[ ] and the value 1111111 (as described herein where the example is for 128 row addressing). Even when the total number of rows is not a binary number, say 100, this multiplexer can be a simple OR logic implementation.

The comparator logic part 209 is therefore configured to carry out a comparison when in a functional mode between the functional address A[ ] and redundant address RA[ ] values and in a test mode between a predetermined value and a test address value.

The comparator logic part 209 can be configured to output the result to an output selector first input, which in some embodiments is a first output selection AND gate or AND logic 217.

The output selector 217 can furthermore receive a further input signal, which can be seen as being a control or gating input from an output selection multiplexer 215.

In case there are multiple redundancy rows, there can be more comparators as 209.

Also, in some embodiments, the redundancy rows are adjacent. In these cases, in addition to the extra comparator mentioned above, there can be adders that add the block or unit increment, for example the value '1111111' or '127' to the RA address such that each comparator can be accessed.

The test circuitry 200 further comprises an output selector multiplexer 215. The output selector multiplexer 215 is configured in some embodiments to receive a selector input from the TBIST input 13, a first input from the redundant row address enable (RRAE) input 213 and a second input from the test redundant row address enable (TRRAE) input 9 (in other words the most significant bit value or values from the test address from the mBIST circuitry). The output of the output selector multiplexer 215 is configured to operate in such a way that the TRRAE input 9 is passed when the TBIST input 13 is enabled and the RRAE input 213 is passed when the TBIST input is not enabled.

The output of the output selector 217 provides a match output MATCH 15 which can be output as the MATCH output 15 and output to the memory BIST circuitry 1. As such the match output signal can be configured to be the indicator of whether or not there is an error in the current configuration (in other words either with or without the first row address).

Figure 4:
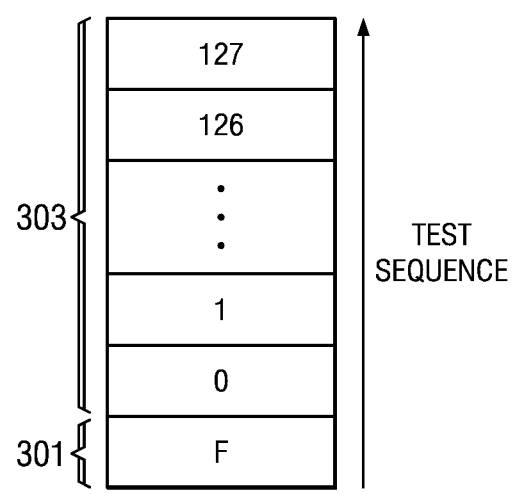
FIG. 4 shows schematically the input test sequence order according to an embodiment of the application.

With respect to FIG. 4, a proposed algorithm can be shown with regards to the architecture described with regards to FIG. 3. In such a sequence the test sequence can be input to the memory.

In some embodiments of the application the testing of the memory can be performed both before (pre-repair) and after (post-repair) repair.

The test sequence shown shows a first part of the test sequence 301 shown as F where F is the failure address. In case of TBIST=1, F is a bus of logic "1", thanks to 205. The test sequence also shows a second part showing the testing of rows (or memory words) between 0 and 127 of the 128 rows available in these examples herein.

In such embodiments a built-in self-test run before repair test can be enabled by enabling the value of TBIST, in other words placing a "1" value to the TBIST input. Furthermore the redundant row address enable signal is not enabled and can have any value. In such embodiments where the functional A and therefore test TA address space spans a space $2^m$ where m is the width of the A[ ] and memory TA[ ] bus, for example in the examples shown TA[0:6] is 0, 1, 2, . . . 126, 127 can be expanded to an address space spanning the addresses 255, 0, 1, 2, . . . 126, 127 with the addresses 255 achievable because of the TRRAE input. Furthermore the RA value is not applicable or ignored as the TBIST value is 'effectively' passed through redundant row selector 205. In such a test provided the memory test produces a positive result, then the repair is possible and the comparator logic part 209 has been tested to be acceptable. The comparator output is single bit and provides the MATCH signal when selectively gated by the use of the TRRAE signal (the extended TA[ ] bit value). When the signal MATCH=1, it can be seen that the entire input buses are matched. In other words, having a single output MATCH pin enables testing the comparator logic using an ATPG algorithm.

However, in the situation where the memory has been determined to contain an error, in such embodiments a repair address is generated, and the repair address can be blown in the fuse (or stored in a suitable manner). The repair address can then in some embodiments be read from the fuse (or suitable repair address storage) at the time of power-up of the memory circuit or integrated chip. The repair address in some embodiments can be used to form the failing row info, or in other words the RA pin information.

A second or post repair test operation can be then performed which follows the same process as the initial or pre-repair test. However, the output selector multiplexer 215 when operated in BIST mode does not output the RRAE value but the TRRAE value instead.

The output of this post-repair test in such embodiments generates failing information again. However, when the post-repair test data is compared with the pre-repair test data (in other words the already present info on RA) and the pre-repair and post-repair data match, then all the logic between the memory+BIST to the fuse is correct and error free. In other words, in such embodiments the logic involved in blowing the fuse (storing the RA data) and retrieving the data from the fuse (retrieving the RA data) is error free and tested.

By testing in such a manner, it is possible to enable a 100% known memory array fault coverage with also a 100% address decoder fault coverage. Furthermore, as the repair circuitry is tested, there is a 100% repair test coverage.

Furthermore, there is a minimal additional complexity in the design and the test algorithm, there is little or no impact on the built-in self-test area and only the start address is required to be changed. Furthermore, the impact on complexity on the BIST is not affected in embodiments where the memory address count is non-binary. For example, where in some embodiments there are 100 words in the memory (or 100 rows of memory cells), then also the impact is the same as 128 words. Furthermore, there is a minimal impact on the memory area which is estimated to affect less than 0.1% of an average cut size.

Furthermore, there is a minimal impact on the test time. For example, a 2K×32 m4 cut size, the time required to carry out the test increases from 2048 to 2056 cycles, in other words 0.4% of an increase.

It should be appreciated that some embodiments of the present invention have been described in relation to BIST memory. It should be appreciated that embodiments of the present invention can be used with any BIST arrangement.

The described arrangements show multiplexers and de-multiplexers. It should be appreciated that in alternative embodiments of the invention, these can be replaced by any other suitable selection circuitry.

In the described arrangements show examples of logic gates such as AND or OR gates. It should be appreciated that these gates may be replaced by other circuitry or other types of logic gates.

Whilst this detailed description has set forth some embodiments of the present invention, the appended claims cover other embodiments of the present application which differ from the described embodiments according to various modifications and improvements. Other applications and configurations may be apparent to the person skilled in the art.

What is claimed is:

1. A circuit, comprising:
   an input node adapted to receive a test address input signal including a first set of bits and a second bit;
   circuitry adapted to use the first set of bits within the test address input signal as a first address signal configured to select a first address of a first part of a memory circuit to be tested, and further adapted to use the second bit within the test address input signal as a second signal configured to select a second part of the memory circuit to be tested; and
   test circuitry configured to use the first address and the second bit in a test mode.

2. The circuit as claimed in claim 1, wherein the test circuitry is adapted to test the first part of the memory circuit to be tested using the first set of bits and a first value of the second signal to produce a first test result.

3. The circuit as claimed in claim 2, wherein the test circuitry is further adapted to test the second part of the memory circuit to be tested using the first set of bits and a second value of the second signal to produce at least a second test result.

4. The circuit as claimed in claim 3, wherein the second part of the memory circuit to be tested comprises at least one comparator, each comparator configured to compare the first set of bits and a determined value associated with each comparator to generate a check result, wherein the check result is at least one of the first and second test result.

5. The circuit as claimed in claim 4, further comprising a determined value generator adapted to be coupled to the at least one comparator, wherein in a test mode the determined value generator is configured to generate a value associated with each comparator.

6. The circuit as claimed in claim 5, wherein the determined value generator in a functional mode is adapted to output a value associated with a faulty memory address.

7. The circuit as claimed in claim 4, further comprising a selector adapted to selectively output the check result dependent on the second signal.

8. The circuit as claimed in claim 7, wherein the selector comprises:
   an AND logic gate comprising a first input configured to receive the check result and a second input adapted to selectively receive the second signal.

9. The circuit as claimed in claim 7, further comprising a second signal selector coupled to the selector and adapted to selectively output the second signal when the circuit is in the test mode.

10. The circuit as claimed in claim 9, wherein the second signal selector comprises a multiplexer adapted to output as the second signal the second bit when the circuit is in the test mode.

11. The circuit as claimed in claim 1, wherein the circuit to be tested is an integrated circuit.

12. The circuit as claimed in claim 1, further comprising:
   a test controller adapted to be coupled to the circuit to be tested and generate the test address input signal.

13. The circuit as claimed in claim 12, wherein the test controller is further adapted to receive the circuit test result.

14. The circuit as claimed in claim 12, wherein the circuit to be tested comprises at least one memory circuit and the test controller comprises at least one memory built-in self-test circuit.

15. The circuit as claimed in claim 12, wherein the circuit to be tested is a component of a system on chip.

16. A method, comprising:
   receiving a test address input signal including a first set of bits and a second bit;
   using the first set of bits within the test address input signal as a first address signal configured to select a first address of a first part of a memory circuit to be tested;
   using the second bit within the test address input signal as a second signal configured to select a second part of the memory circuit to be tested; and
   operating a test circuit using the first address and the second bit in a test mode.

17. The method as claimed in claim 16, wherein operating the test circuit comprises testing the first part of the memory circuit using the first part of the test address input signal and the first value of the second signal to produce a first test result.

18. The method as claimed in claim 17, wherein operating the test circuit further comprises testing the second part of the memory circuit using the first part of the test address input signal and a second value of the second signal to produce at least a second test result.

19. The method as claimed in claim 18, wherein selecting the second part of the memory circuit comprises selecting at least one comparator, and operating the test circuit further comprises comparing the first part of the test address input signal and a determined value associated with each comparator to generate a check result, wherein the check result is at least one of the first and second test result.

20. The method as claimed in claim 19, further comprising generating a determined value to be associated with each of the at least one comparator.

21. The method as claimed in claim 20, wherein generating a determined value in a functional mode comprises generating a value associated with a faulty memory address.

22. The method as claimed in claim 19, further comprising selectively outputting the check result dependent on the second signal.

23. The method as claimed in claim 22, wherein selectively outputting the check result comprises ANDing the check result and the second signal.

24. The method as claimed in claim 22, further comprising selectively outputting the second signal when the circuit to be tested is in the test mode.

25. The method as claimed in claim 24, wherein selectively outputting the second signal when the circuit to be tested is in the test mode comprises outputting as the second signal the second bit when the circuit to be tested is in the test mode.

26. The method as claimed in claim 16, further comprising generating the test address input signal.

27. A circuit, comprising:
- a first input adapted to receive a functional memory address for a memory to be tested;
- a second input adapted to receive a memory test address for the memory to be tested;
- a first multiplexer having inputs coupled to the first and second inputs and further having a selection input adapted to receive a built-in self test control signal, the first multiplexer adapted to select for output between the functional memory address and the memory test address in response to the built-in self test control signal;
- a third input adapted to receive a memory redundancy address;
- a first logic circuit having inputs coupled to the third input and to the built-in self test control signal, the first logic circuit adapted to output a logical combination of the memory redundancy address and the built-in self test control signal; and
- a comparison circuit adapted to receive and compare the output of the first multiplexer and the output of the first logic circuit to generate a first output signal.

28. The circuit according to claim 27, further comprising:
- a fourth input adapted to receive a redundant row address enable signal;
- a fifth input adapted to receive a test redundant row address enable signal;
- a second multiplexer having inputs coupled to the fourth and fifth inputs and further having a selection input adapted to receive the built-in self test control signal, the second multiplexer adapted to select for output between the redundant row address enable signal and the test redundant row address enable signal in response to the built-in self test control signal.

29. The circuit according to claim 28, further comprising:
- a second logic circuit adapted to receive and logically combine the first output signal and the output of the second multiplexer so as to output a second output signal.

30. The circuit according to claim 29, wherein the second logic circuit is adapted to perform a logical ANDing operation with respect to the first output signal and the output of the second multiplexer.

31. The circuit according to claim 27 wherein the first logic circuit is adapted to perform a logical ORing operation with respect to the memory redundancy address and the built-in self test control signal.

* * * * *